(12) United States Patent
Cheah et al.

(10) Patent No.: US 7,402,845 B2
(45) Date of Patent: Jul. 22, 2008

(54) CASCODED RECTIFIER PACKAGE

(75) Inventors: Chuan Cheah, Redondo Beach, CA (US); Kunzhong Hu, Santa Monica, CA (US)

(73) Assignee: International Rectifier Corporation, El Segundo, CA (US)

( * ) Notice: Subject to any disclaimer, the term of this patent is extended or adjusted under 35 U.S.C. 154(b) by 36 days.

(21) Appl. No.: 11/649,120

(22) Filed: Jan. 3, 2007

(65) Prior Publication Data

US 2007/0176291 A1    Aug. 2, 2007

Related U.S. Application Data

(60) Provisional application No. 60/755,646, filed on Dec. 30, 2005.

(51) Int. Cl.
    *H01L 31/0328*    (2006.01)

(52) U.S. Cl. .......................... 257/192; 257/200; 257/744; 257/121; 257/E29.215; 257/E29.31
(58) Field of Classification Search ................ 257/192, 257/E29.215
See application file for complete search history.

(56) References Cited

U.S. PATENT DOCUMENTS 5,616,886 A * 4/1997 Romero et al. ............. 174/542
7,329,909 B2 * 2/2008 Saito et al. .................. 257/192

* cited by examiner

*Primary Examiner*—Tu-Tu V Ho
(74) *Attorney, Agent, or Firm*—Ostrolenk, Faber, Gerb & Soffen, LLP

(57) ABSTRACT

A semiconductor package that includes a compound component and a diode arranged in a cascode configuration to function as a rectifier.

11 Claims, 4 Drawing Sheets

US 7,402,845 B2

CASCODED RECTIFIER PACKAGE

RELATED APPLICATION

This application claims benefit of U.S. Provisional Application Ser. No. 60/755,646, filed on Dec. 30, 2005, entitled GaN Cascoded Rectifier and Package Therefor, incorporated in full herein by reference.

FIELD OF THE INVENTION

The present invention relates to power semiconductor rectifier packages and particularly to III-nitride type compound semiconductor component (CSC) heterojunction type semiconductor devices, including bidirectional III-nitride transistors, used in such packages.

BACKGROUND OF THE INVENTION

Power semiconductor devices, including rectifiers used for PFC (power factor correction) applications, that include a single material semiconductor device, such as a silicon-based power semiconductor device (e.g. silicon-based or SiC based diodes), are well known. For example, silicon carbide (SiC) high voltage schottky rectifiers offer an absence of recovery charges, which makes them suitable for hard switched, high frequency applications like power factor correction. However, such rectifiers typically have inherent weaknesses, such as a surge current capability and forward conduction limitations.

CSC transistors, e.g. heterojunction III-nitride based power semiconductor devices (referred to hereafter as compound semiconductor component, or CSC), for example, high electron mobility transistors (HEMTs), metal insulator semiconductor (MISHEMTs), metal oxide semiconductor (MOSHEMTs), and the like devices, are known. An example of a bidirectional CSC is disclosed in U.S. patent application Ser. No. 11/056,062, assigned to International Rectifier and incorporated herein by reference. It is known to arrange a bidirectional CSC with a diode in a cascode configuration in a circuit to obtain a rectifier suitable for applications such as PFC.

It is desirable to have a CSC packaged with a diode to use as a rectifier package that can be used as an integrated device in a power application such as a PFC.

SUMMARY OF THE INVENTION

A semiconductor package according to the present invention includes a substrate having a first conductive pad and a second conductive pad spaced and isolated electrically from the first conductive pad both pads disposed on a common surface; a III-nitride compound semiconductor component including two power electrodes, and a gate electrode; a diode arrangement connected at one pole thereof to one of the power electrodes through the first conductive pad and to the gate electrode at another one of the poles through the second conductive pad, whereby the diode arrangement and the compound semiconductor component are operatively connected to one another wirebondlessly.

In the preferred embodiment, the CSC is a bidirectional switch having two gate electrodes and the diode arrangement includes two diodes. A package according to the present invention may further include a strap for connecting the diode arrangement to one of the gates of the CSC. Furthermore, the package may include a heat spreader which thermally connects the CSC to the substrate.

Other features and advantages of the present invention will become apparent from the following description of the invention which refers to the accompanying drawings.

DETAILED DESCRIPTION OF THE FIGURES

Figure 1A:
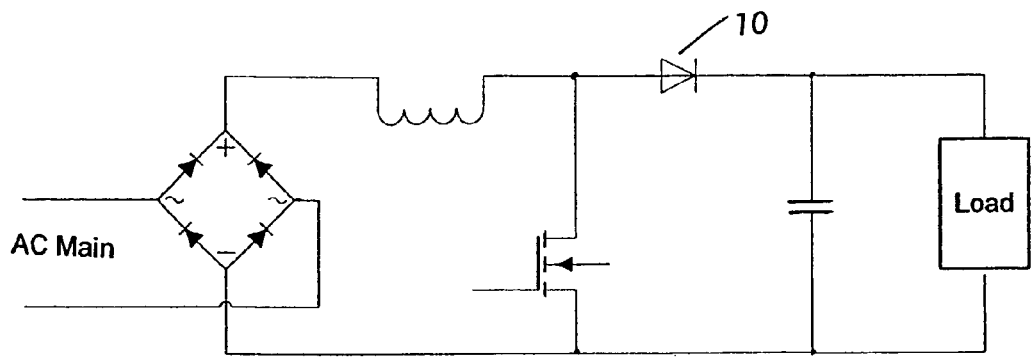
FIG. 1A shows a circuit diagram of a boost converter according to the prior art.

Referring to FIG. 1A, a typical PFC circuit may be a boost circuit which includes a diode 10 as a rectifier.

Figure 1B:
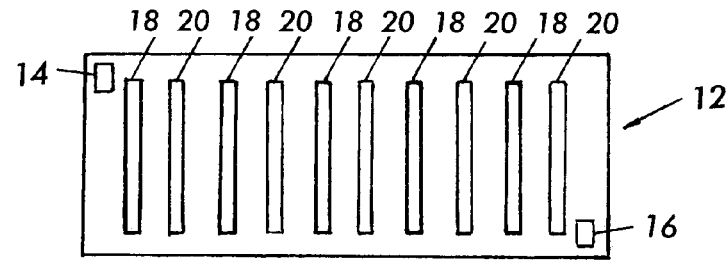
FIG. 1B shows a top plan view of a bidirectional CSC used in a package according to the present invention.

Referring to FIG. 1B, a typical bidirectional CSC 12 includes a first gate pad 14 disposed at one corner of the die, a second gate pad 16 disposed at another opposing corner of the die, first power electrodes 18, and second power electrodes 20. Note that first and second power electrodes 18 and 20 may be alternately arranged. In a bidirectional first and second power electrodes 18, 20 may serve as both source or drain depending on the direction of the current.

Figure 2:
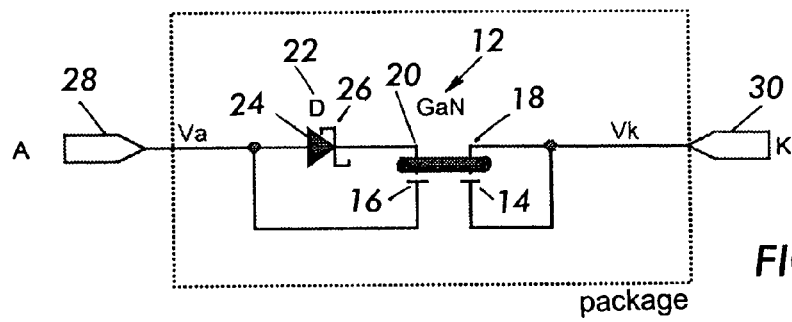
FIG. 2 illustrates a cascoded rectifier arrangement using a bidirectional CSC and a diode arrangement.

FIG. 2 illustrates schematically the arrangement of a bidirectional CSC and a diode arrangement (or a plurality) of diodes to form a cascoded rectifier which can replace diode 10 in a PFC circuit. The arrangement includes a bidirectional CSC 12, having first gate pad 14 thereof shorted to its first power electrodes 18, and second gate pad 16 thereof shorted to second power electrodes 20 through a diode arrangement 22. Note that diode arrangement 22 may include a single diode having the anode 24 thereof shorted to an external lead and the cathode 26 thereof shorted to second power electrodes 20 of CSC 12. Note further that first power electrodes 18 of CSC 12 are shorted to another external lead 30. Diode arrangement 22 may be two or more diodes connected to obtain the same rating of a larger diode.

Figure 3:
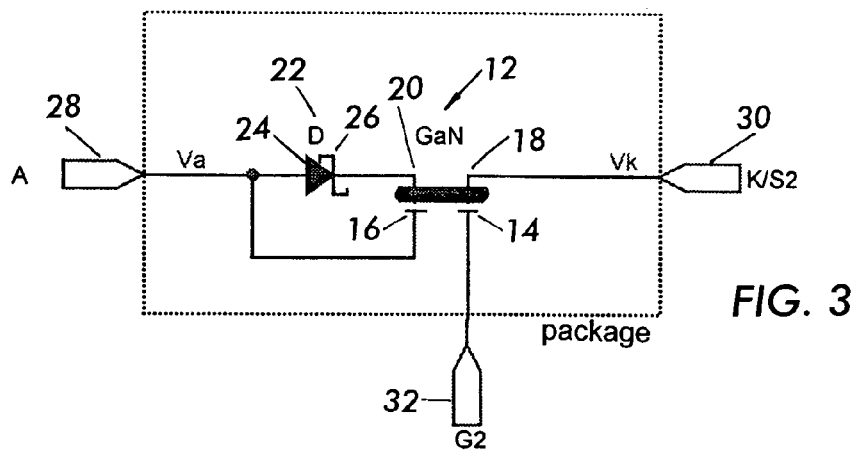
FIG. 3 illustrates another cascoded rectifier arrangement using a bidirectional CSC and a diode arrangement.

Referring now to FIG. 3, in an alternative arrangement, first gate pad 14 of CSC 12 may be shorted to another external lead 32 instead of being shorted to first power electrodes 18 of CSC 12. In all other respects, the arrangement shown by FIG. 3 is identical to the one shown by FIG. 2.

Referring now to FIGS. 4A-4F, a semiconductor package according to the preferred embodiment of the present invention includes substrate 34, which may be an IMS, DBC or the like, CSC 12, two diodes 22A, 22B, which constitute diode arrangement 22, and molded housing 36. Note that molded housing 36 is rendered transparent in FIG. 4A for better illustration. Further note that diodes 22A, 22B may be replaced with a single diode.

First and second power electrodes 18, 20 of CSC 12 are electrically and mechanically coupled to respective conductive fingers 38, 40 on substrate 34, and cathode electrodes of diodes 22A, 22B are electrically and mechanically coupled to a conductive pad 42 on substrate 34. Conductive fingers 38 are connected to second power electrodes 20 and are integral with conductive pad 42 whereby second power electrodes 20 are electrically connected to cathode electrodes of diodes 22A, 22B.

Figure 4A:
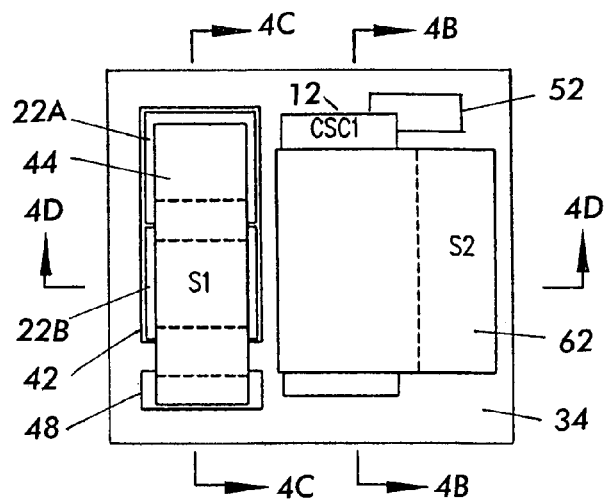
FIG. 4A shows a top plan view of a package according to the present invention.
Figure 4B:
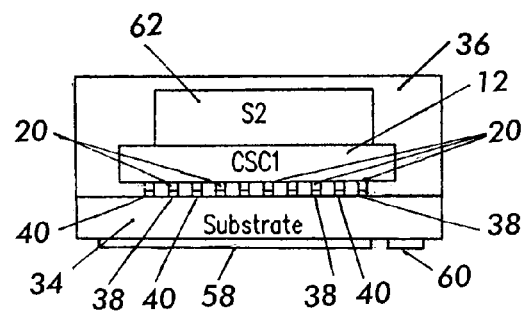
FIG. 4B shows a cross-sectional view along line 4B-4B viewed in the direction of the arrows.
Figure 4C:
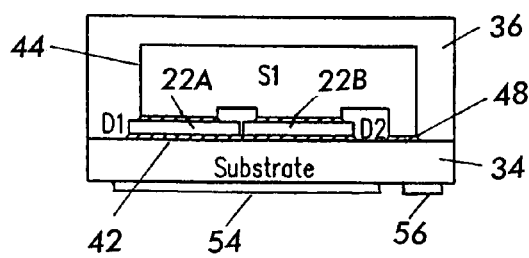
FIG. 4C shows a cross-sectional view along line 4C-4C viewed in the direction of the arrows.
Figure 4D:
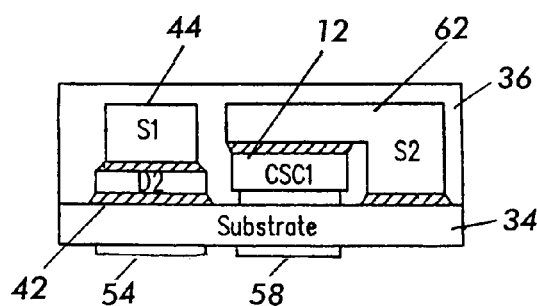
FIG. 4D shows a cross-sectional view along line 4D-4D viewed in the direction of the arrows.
Figure 4E:
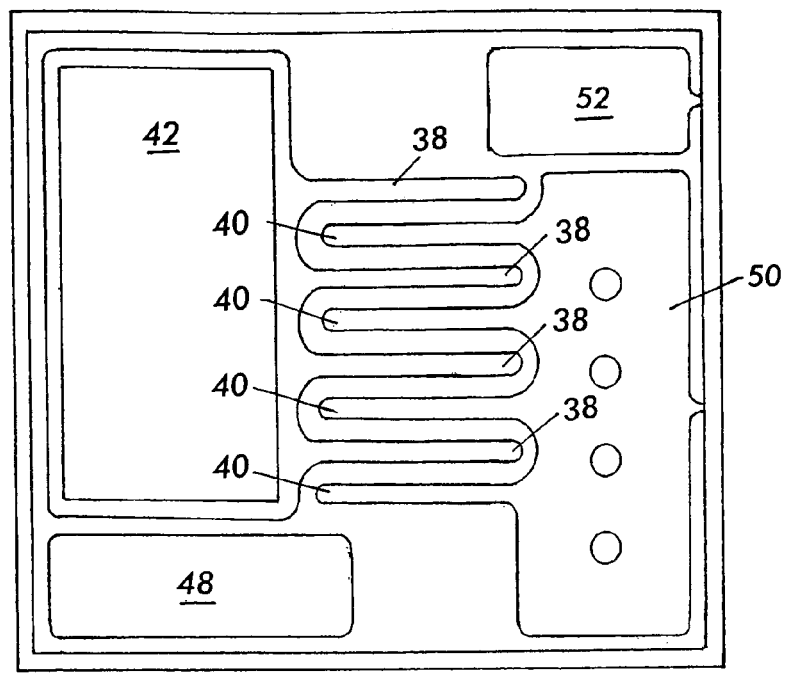
FIG. 4E shows a top plan view of a substrate used in a package according to the present invention.
Figure 4F:
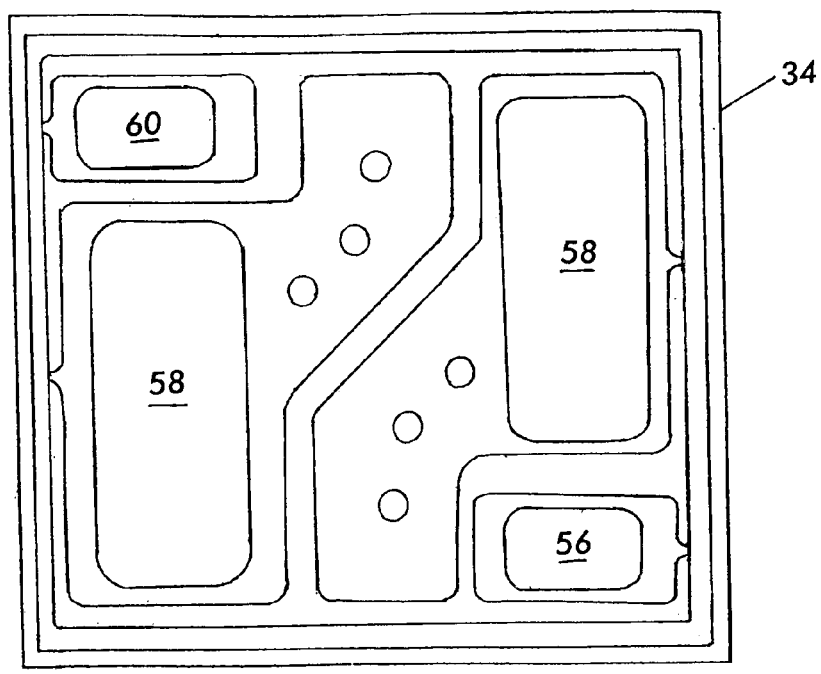
FIG. 4F illustrates a bottom plan view of a substrate used in a package according to the present invention.

A conductive strap 44 (formed preferably from copper or copper alloy) is electrically and mechanically coupled to the anode electrodes of diodes 22A, 22B and electrically and mechanically coupled to a second conductive pad 48. Fingers 40 are electrically and mechanically coupled to first power electrodes 18 of CSC 12 and are integral with a third conductive pad 50. Note that substrate 34 includes a fourth conductive pad 52, which is electrically and mechanically coupled to first gate pad 14 of CSC 12. Also note that each conductive pad 42, 48, 50, 52 is electrically connected to a respective land on an opposing surface of substrate 34 through one metal filled via or a number of metal filled vias (not shown) in substrate 34. Thus, conductive pad 42 is connected to land 54, pad 48 is connected to land 56, pad 50 is connected to land 58, and pad 52 is connected to land 60. Lands 54, 56, 58 and 60 serve as leads for external connection to the package. FIG. 4F shows the bottom view of the package to illustrate the land arrangement in the preferred embodiment.

According to one aspect of the present invention, a heat spreader 62 (formed preferably from copper or a copper alloy) is thermally and mechanically connected to the back of CSC 22 using a thermal epoxy or the like material. Heat spreader 62 is then extended to and thermally coupled to substrate 34 using a thermally conductive adhesive such as a thermal epoxy or the like. Molded housing 36, which is preferably formed from a mold compound, preferably covers strap 44, heat spreader 36, and encapsulates diodes 22A, 22B, and CSC 12.

Note that to obtain electrical and mechanical coupling as disclosed herein a conductive adhesive such as a conductive epoxy or solder may be used.

Figure 5A:
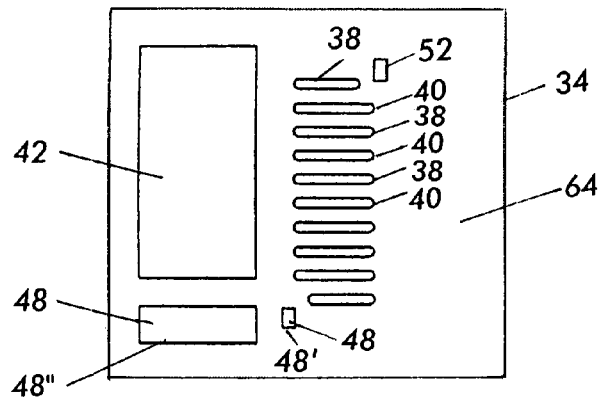
FIGS. 5A-5D illustrate selected steps in the fabrication of a package according to the present invention.
Figure 5B:
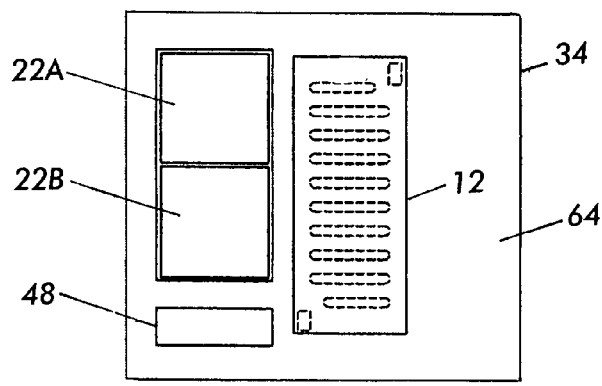
Figure 5C:
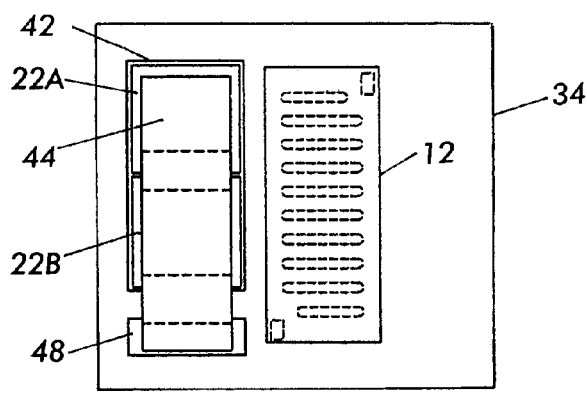

Referring to FIGS. 5A-5D, in order to fabricate a package according to the present invention, first a layer of solder resist 64 is applied to the top surface of substrate 34 (see FIG. 4E) and patterned to include openings over fingers 38, 40, pads 42, 48, 56, 52 as illustrated by FIG. 5A. Next, a conductive adhesive (e.g. solder or conductive epoxy) is applied to pad 42, and fingers 38, 40 which are exposed through openings in solder resist 64. Cathode electrodes of diodes 22A, 22B are then disposed over the conductive adhesive on pad 42, and CSC 12 is flip mounted such that second power electrodes 20 thereof are disposed on the conductive adhesive on fingers 38. Similarly, first power electrodes 18 are disposed on the conductive adhesive on fingers 40. In addition, first gate pad 14 of CSC 12 is disposed on the conductive adhesive that is on pad 52, and second gate pad 16 is disposed on the conductive adhesive that is on pad 48. Note that pad 48 is exposed through two openings 48', 48". Opening 48' receives a conductive adhesive body for connection to second gate pad 16. Thereafter, a conductive adhesive is applied to the anode electrodes of diodes 22A, 22B and pad 48 through opening 48", and the arrangement is exposed to heat to cure the adhesive. For example, if solder is used, the arrangement is taken to the reflow temperature of the solder. FIG. 5C illustrates the results after the curing step.

Figure 5D:
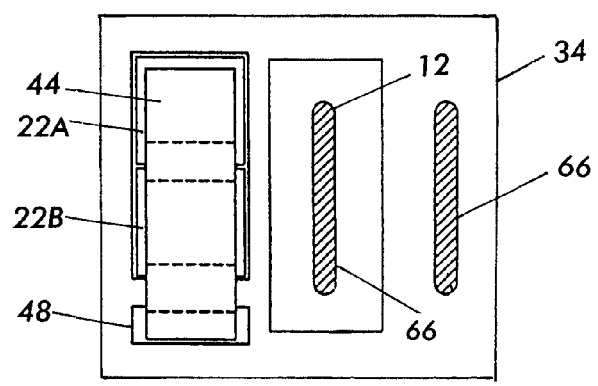

Next, a thermally conductive adhesive 66 (e.g. thermal epoxy) is applied to the back of CSC 12 and a portion of substrate 34 (see FIG. 5D). Spreader 62 is then disposed on both thermally conductive adhesive bodies 66, and cured, for example, in a thermal step. Thereafter, mold compound is applied to form molded housing 36 as explained, whereby a package according to the present invention is obtained.

Advantageously, no wirebonding is used to integrate CSC 12 and diode arrangement 22, which may reduce packaging related parasitic resistance and inductance.

Moreover, using a combination thermally conductive substrate such as an IMS, a conductive strap and a heat spreader may result in favorable thermal characteristics.

Although the present invention has been described in relation to particular embodiments thereof, many other variations, combinations of features, and modifications and other uses will become apparent to those skilled in the art. It is preferred, therefore, that the present invention be limited not by the specific disclosure herein, but only by the appended claims.

What is claimed is:

1. A semiconductor package, comprising:
   a substrate having a first conductive pad and a second conductive pad spaced and isolated electrically from said first conductive pad both pads disposed on a common surface;
   a III-nitride compound semiconductor component including two power electrodes, and a gate electrode;
   a diode arrangement connected at one pole thereof to one of said power electrodes through said first conductive pad and to said gate electrode at another one of said poles through said second conductive pad, whereby said diode arrangement and said compound semiconductor component are operatively connected to one another wirebondlessly.

2. The package of claim 1, further comprising a conductive strap electrically connected between said another one of said poles and said second conductive pad.

3. The package of claim 1, further comprising a heat spreader thermally connected to said compound semiconductor component and thermally connected to said substrate.

4. The package of claim 1, further comprising a third conductive pad electrically connected to another one of said power electrodes.

5. The package of claim 4, wherein said compound semiconductor component includes another gate electrode and further comprising a fourth conductive pad electrically connected to said another gate electrode.

6. The package of claim 4, wherein each power electrode is electrically connected to a conductive pad through a respective finger.

7. The package of claim 4, wherein each conductive pad is electrically connected to a respective land on another common surface opposite said common surface.

8. The package of claim 4, wherein each conductive pad is electrically connected to a respective land on another common surface opposite said common surface.

9. The package of claim 1, wherein said diode arrangement includes two diodes.

10. The package of claim 1, wherein said compound semiconductor component is a bidirectional switch.

11. The package of claim 1, wherein said compound semiconductor component includes a plurality of first power electrode and a plurality of second power electrodes, said power electrodes being alternately arranged, wherein each power electrode is electrically and mechanically connected to a respective conductive finger which is connected to a respective conductive pad on said substrate.

* * * * *